United States Patent
Moghimi

(10) Patent No.: US 10,157,627 B1
(45) Date of Patent: Dec. 18, 2018

(54) DYNAMIC SPECTRAL FILTERING

(71) Applicant: BOSE CORPORATION, Framingham, MA (US)

(72) Inventor: Amir Reza Moghimi, Sutton, MA (US)

(73) Assignee: BOSE CORPORATION, Framingham, MA (US)

( * ) Notice: Subject to any disclaimer, the term of this patent is extended or adjusted under 35 U.S.C. 154(b) by 0 days.

(21) Appl. No.: 15/612,168

(22) Filed: Jun. 2, 2017

(51) Int. Cl.
*G10L 21/0232* (2013.01)
*H04R 3/04* (2006.01)
*H03G 5/16* (2006.01)
*G10L 21/0216* (2013.01)

(52) U.S. Cl.
CPC ...... *G10L 21/0232* (2013.01); *G10L 21/0216* (2013.01); *H03G 5/165* (2013.01); *H04R 3/04* (2013.01); *G10L 2021/02163* (2013.01)

(58) Field of Classification Search
CPC .............. G10L 21/0232; G10L 21/0216; G10L 2021/02163; H03G 5/165; H04R 3/04
USPC ....... 381/94.2, 94.3, 94.5, 94.7, 71.11, 94.1; 704/231, 233
See application file for complete search history.

(56) References Cited

U.S. PATENT DOCUMENTS

| 5,657,422 A | 8/1997 | Janiszewski et al. |
| 2003/0053636 A1* | 3/2003 | Goldberg ............. G01S 5/0284 |
| | | 381/71.11 |
| 2007/0136050 A1 | 6/2007 | Tourwe |
| 2009/0147968 A1* | 6/2009 | Inoda ................. G10L 21/0208 |
| | | 381/94.1 |
| 2010/0296668 A1* | 11/2010 | Lee .................... G10K 11/1784 |
| | | 381/94.7 |
| 2014/0079245 A1* | 3/2014 | Maruko ................ H04R 3/002 |
| | | 381/94.7 |
| 2014/0119567 A1* | 5/2014 | DeLine .................... B60R 1/12 |
| | | 381/86 |
| 2014/0185827 A1* | 7/2014 | Kitazawa .............. H04R 3/005 |
| | | 381/94.2 |
| 2016/0012828 A1* | 1/2016 | Chatlani ............ G10L 21/0232 |
| | | 704/205 |
| 2017/0164125 A1* | 6/2017 | Song ...................... H04R 29/00 |
| 2017/0200442 A1* | 7/2017 | Yamabe ............... G10K 11/178 |

FOREIGN PATENT DOCUMENTS

| EP | 1926085 A1 | 5/2008 |
| WO | 9710586 A1 | 3/1997 |

OTHER PUBLICATIONS

International Search Report and Written Opinion in application No. PCT/US2018/035080 dated Jul. 23, 2018.

* cited by examiner

*Primary Examiner* — Vivian Chin
*Assistant Examiner* — Friedrich W Fahnert
(74) *Attorney, Agent, or Firm* — Lando & Anastasi, LLP

(57) ABSTRACT

Audio systems and methods are provided to increase relevant content of an audio signal relative to a noise level, and include filtering the audio signal to remove spectral content below a cutoff frequency, where the cutoff frequency is based upon a noise value.

20 Claims, 7 Drawing Sheets

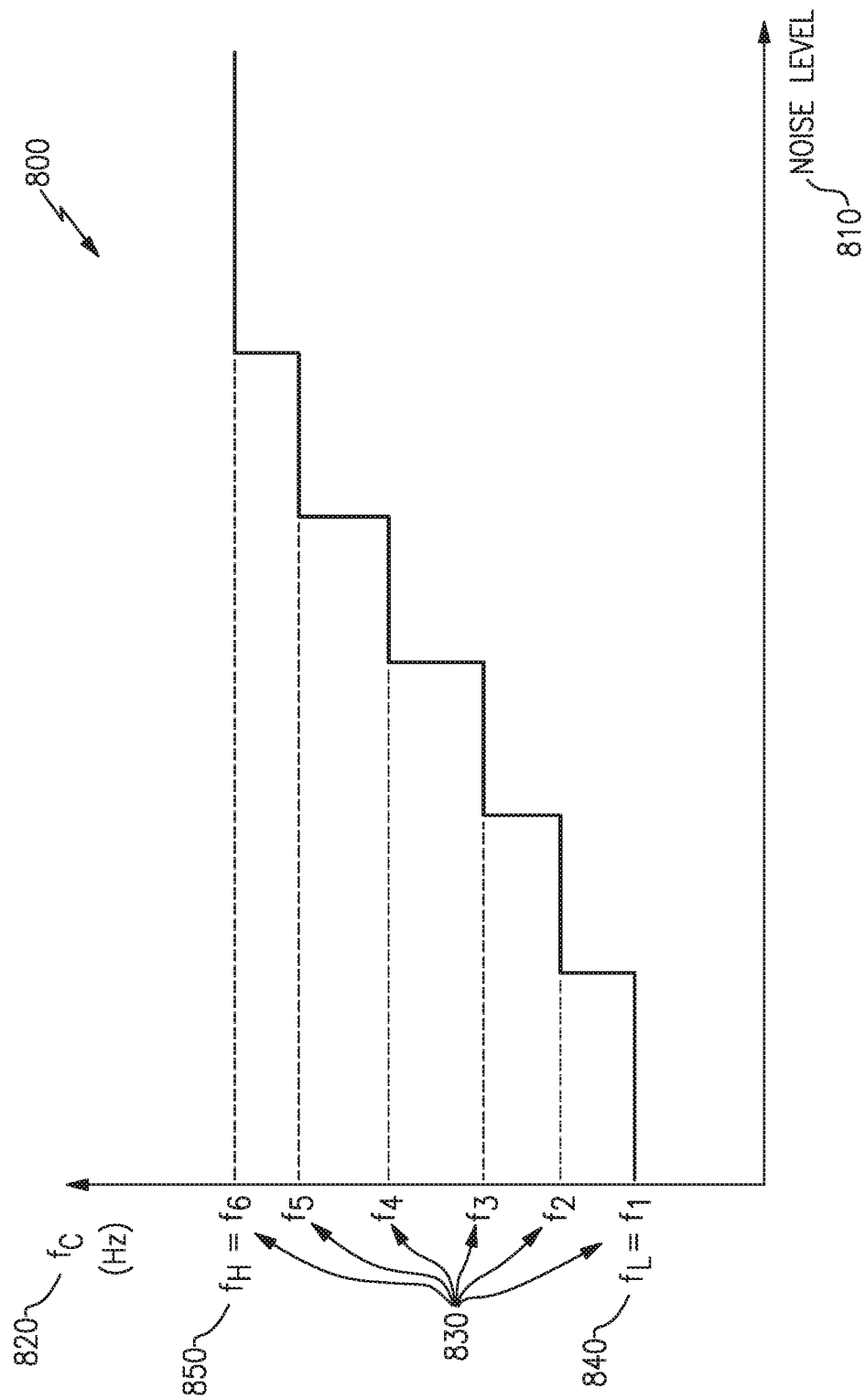

DYNAMIC SPECTRAL FILTERING

TECHNICAL FIELD

Aspects and examples of the present disclosure are directed generally to audio systems, and in some examples, more specifically to systems for improving the signal-to-noise ratio of captured human speech.

BACKGROUND

Many systems use human speech input to provide certain functions and benefits. For example, cellular and other telephone systems pick up a user's voice to provide it to a remote end of a conversation pair, and virtual personal assistants are increasingly capable of accepting user voice input, e.g., with associated speech-to-text or other voice recognition systems. Speech recognition is also used in personal communications (e.g., simple messaging, text messaging systems) and in dictation systems and software. Additionally, transportation and automotive environments may have integral audio and communications functions that may accept user voice as an input for similar or additional functions. Many such applications and environments include noise sources that reduce the quality of an audio signal intended to contain a user's speech or voice.

SUMMARY

Aspects and examples are directed to speech audio capture systems and methods that include dynamic filtering to remove noise at a lower end of the human speech spectrum, even if such filtering also removes some of the user's speech or voice signal. The dynamic filter may be a band-pass or a hi-pass filter, either of which removes frequencies below a certain cutoff frequency, $f_c$, and the cutoff frequency is a dynamic variable selected based upon an amount of noise, e.g., in the environment and/or in the audio signal.

According to one aspect, a method of increasing relevant content of an audio signal relative to a noise level is provided. The method includes receiving an audio signal, receiving a noise measurement, selecting a cutoff frequency based upon the noise measurement, and substantially removing spectral content below the cutoff frequency from the audio signal to provide a filtered signal.

In some examples, selecting the cutoff frequency based upon the noise measurement includes selecting the cutoff frequency based upon a mapping of a range of frequencies to noise levels. The mapping of the range of frequencies to noise levels may include a monotonically increasing function of frequency to noise level. In certain examples, the range of frequencies includes a lower frequency of 100 Hz or less and a higher frequency of 200 Hz or more.

In some examples, selecting the cutoff frequency based upon the noise measurement includes selecting the cutoff frequency based upon a mapping of a set of discrete frequencies to noise levels.

Certain examples include limiting a rate of change of the cutoff frequency based upon a change in the noise measurement.

Some examples include providing the noise measurement, the noise measurement based at least in part upon a microphone located in at least one of a headset, a telephone communications system, a voice-activated assistant, or a passenger compartment.

According to another aspect, a dynamic audio filter is provided and includes an input to receive an audio signal and an output to provide an output signal, a control input to receive a noise signal, the noise signal indicative of a noise level in the audio signal, and a filter configured to substantially remove spectral components of the audio signal below a cutoff frequency, the cutoff frequency based upon the noise level.

In some examples the cutoff frequency is based upon a mapping of a range of frequencies to noise levels. The mapping of the range of frequencies to noise levels may include a monotonically increasing function of frequency to noise level. In certain examples, the range of frequencies includes a lower frequency of 100 Hz or less and a higher frequency of 200 Hz or more.

In certain examples, the cutoff frequency is based upon a mapping of a set of discrete frequencies to noise levels.

In some examples, the filter is further configured to limit a rate of change of the cutoff frequency based upon a change in the noise level.

According to another aspect, a communication system is provided that includes a microphone configured to provide an audio signal and a signal processor configured to receive the audio signal and to filter the audio signal to substantially remove spectral components of the audio signal below a cutoff frequency, the cutoff frequency based upon a noise level in the vicinity of the microphone.

In certain examples, the cutoff frequency is based upon a mapping of a range of frequencies to noise levels. The mapping of the range of frequencies to noise levels may include a monotonically increasing function of frequency to noise level. The range of frequencies may include a lower frequency of 100 Hz or less and a higher frequency of 200 Hz or more.

In some examples, the cutoff frequency is based upon a mapping of a set of discrete frequencies to noise levels.

In some examples, the signal processor is further configured to limit a rate of change of the cutoff frequency based upon a change in the noise level.

Certain examples include a noise estimate component configured to provide the noise level.

Still other aspects, examples, and advantages are discussed in detail below. Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the invention. In the figures, identical or nearly identical components illustrated in various figures may be represented by a like numeral. For purposes of clarity, not every component may be labeled in every figure. In the figures:

FIG. 8 is a graph of another example mapping of noise levels to cutoff frequencies.

DETAILED DESCRIPTION

Figure 1:
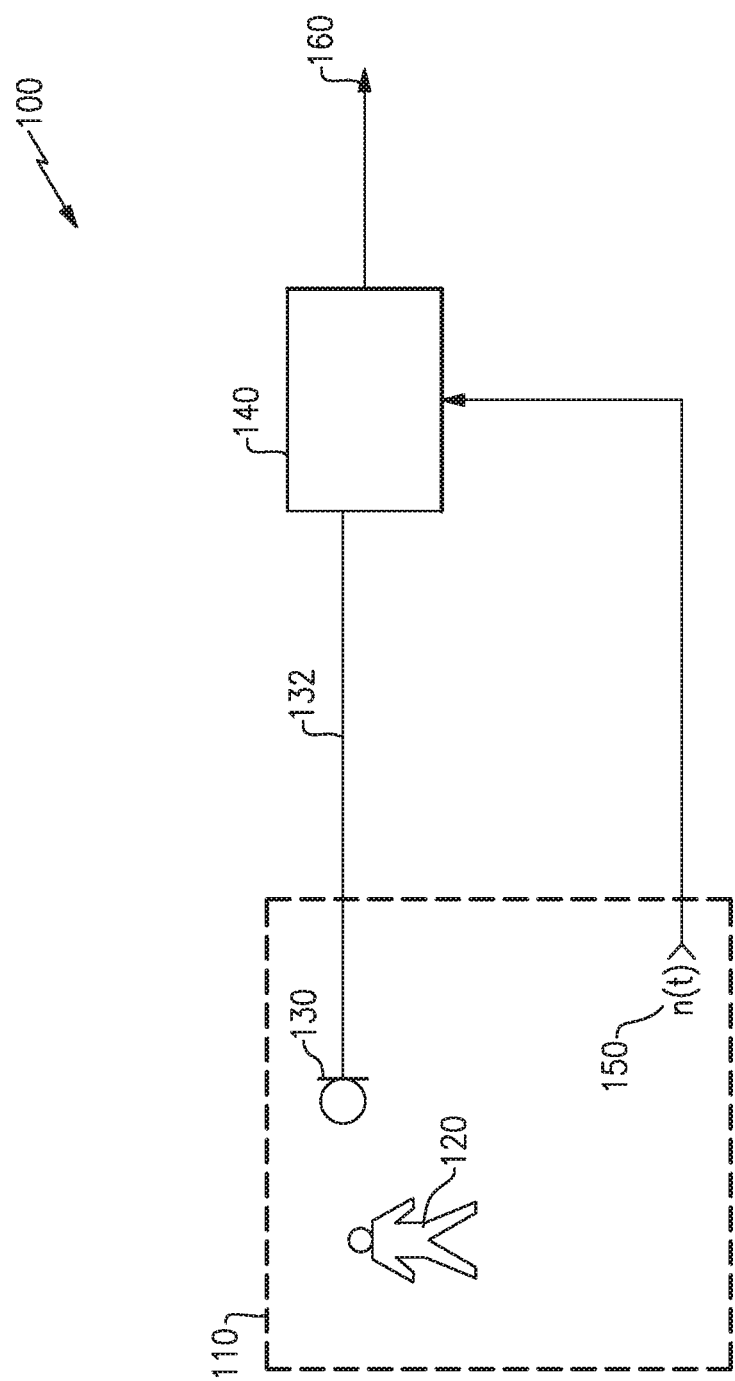
FIG. 1 is an example audio filtering system.

Aspects of the present disclosure are directed to audio systems and methods that increase linguistically relevant content of an audio signal relative to a noise level, by filtering out lower frequency spectral components based upon the level of noise. A cutoff frequency below which the spectral components are reduced (or attenuated) is dynamically selected based upon a measurement or an estimate of the noise level in the environment and/or in the audio signal.

Capturing a person's voice, for voice communications or speech-based applications, for example, may present a challenge in certain environments. Road noise in a car, airplane engine noise, wind noise, machinery noise, and many other environmental background noise sources may have more energy at lower frequencies. Thus in some scenarios, a speech-to-noise ratio may be particularly low at the lower frequencies. However, human speech has little informational content at lower frequencies, such that an overall speech-to-noise ratio may be significantly increased by filtering out the noise-heavy portions at the lower end of the spectrum. In the alternative, the lower frequencies are retained if the environment is not very noisy.

If the person's voice being captured is sent to another person, for example in a telephone conversation, high noise content in the lower frequency range may overly reduce the intelligibility of the speaker as determined by the listener. Such may be due, in part, to a psychoacoustic phenomenon known as masking, and in particular the upward spread of masking. Noise at the lower frequencies masks the intended speech signal not only at those frequencies, but also at the higher frequencies, and as such interferes with human listeners' ability to hear and interpret the speech content. Thus, in accord with aspects and examples disclosed herein, reducing the noise (and speech) content at lower frequencies in noisy environments may retain linguistically relevant information at the higher frequencies but reduce upward masking, such that intelligibility is significantly increased. Additionally, for speech recognition and other electronic or automated applications not involving a human listener, the overall reduction of noise content while retaining linguistically relevant content provides a benefit to and enhances performance of such systems.

Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example.

It is to be appreciated that examples of the methods and apparatuses discussed herein are not limited in application to the details of construction and the arrangement of components set forth in the following description or illustrated in the accompanying drawings. The methods and apparatuses are capable of implementation in other examples and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

FIG. 1 illustrates an example of a system 100 in an environment 110 where it is desirable to pick-up or capture the voice (or speech) of a user 120. The system 100 includes a microphone 130 that provides an audio signal 132 to a filter 140. The filter 140 is dynamically adjusted based upon a noise signal 150 to provide an output signal 160. The filter 140 removes spectral content below a cutoff frequency, $f_c$, from the audio signal 132. Accordingly, the filter 140 is a hi-pass or a band-pass filter that removes some lower frequency content from the audio signal.

The filter 140 may remove both speech content and noise content below the cutoff frequency, $f_c$, but the output signal 160 has an improved speech-to-noise ratio, at least to the extent that the speech portion includes more linguistically relevant information relative to the background noise component. In other words, while the filter 140 may remove both speech and noise content, the filter 140 removes more noise content than it removes relevant speech content, effectively increasing the intelligibility of the speech amongst the noise.

In certain examples, additional microphones may be employed to provide either or both of the audio signal and the noise signal to the filter 140. In some examples, additional processing may be employed, such as array beamforming and/or null-steering techniques, and/or outputs of adaptive filters, and the like, to provide either or both of the audio signal and the noise level to the filter 140.

Some examples may operate in post-processing of previously captured or recorded signals. For example, an audio signal may be a recorded or a stored signal, and a noise estimate, noise signal, or noise level may also be recorded or stored and provided to a dynamic filter that filters the signal with a cutoff frequency based upon the noise, to produce a filtered signal, which may be provided to other systems, or stored, or both.

Human speech tends to fall in a spectral range from about 50 Hz to 10,000 Hz. Linguistically essential spectral content may be above about 600 Hz, or above a range of about 400 Hz to 800 Hz, for example, in that human listeners are likely to comprehend the speech despite considering it of poor quality. Speech content above about 200-400 Hz, or above about 300 Hz, is typically more than sufficient for most listeners to recognize and easily understand the person speaking, and to consider it to be of acceptable quality. Spectral content below these ranges provides richness and tone, thus sounding more natural to the human ear, but may not be necessary for intelligibility. On the contrary, high noise in these lower spectral regions may overly degrade intelligibility. The spectral content of background noise in many environments tends to be heavily weighted in these lower frequencies. Accordingly, a significant amount of noise may be removed from an audio speech signal by removing content below a cutoff frequency in the range of about 300-600 Hz, without significantly affecting intelligibility of the speech. When there is less noise in the signal to begin with, however, there may be no reason to filter out the lower frequency components and they are instead retained. Accordingly, the filter 140 is a dynamic filter that removes lower frequency components but adjusts the cutoff frequency based upon the general level of background noise.

Additionally, many automatic speech recognition systems perform equally well when speech content below about 300 Hz is removed. Many automatic speech recognition systems also perform equally well when speech content below about 600 Hz is removed, especially if such systems have been trained with signals having a similar spectral limit.

The environment 110 may include any environment or situation in which a user's voice is desired to be captured, and may include, for example, automobile or other transportation compartments, office environments, the outdoors, industrial environments, etc. The filter 140 may be an analog filter or a digital filter and may include additional processing components such as analog to digital converters (ADC) and/or digital to analog converters (DAC), and may be a component of a larger system having various other signal processing capabilities and functions as necessitated by varying system characteristics and operational requirements.

Production of a signal wherein a user's speech components are enhanced relative to other components, such as noise, is referred to generally herein as voice pick-up, voice selection, voice isolation, speech enhancement, and the like. As used herein, the terms "voice," "speech," "talk," and variations thereof are used interchangeably and without regard for whether such speech involves use of the vocal folds.

Figure 2:
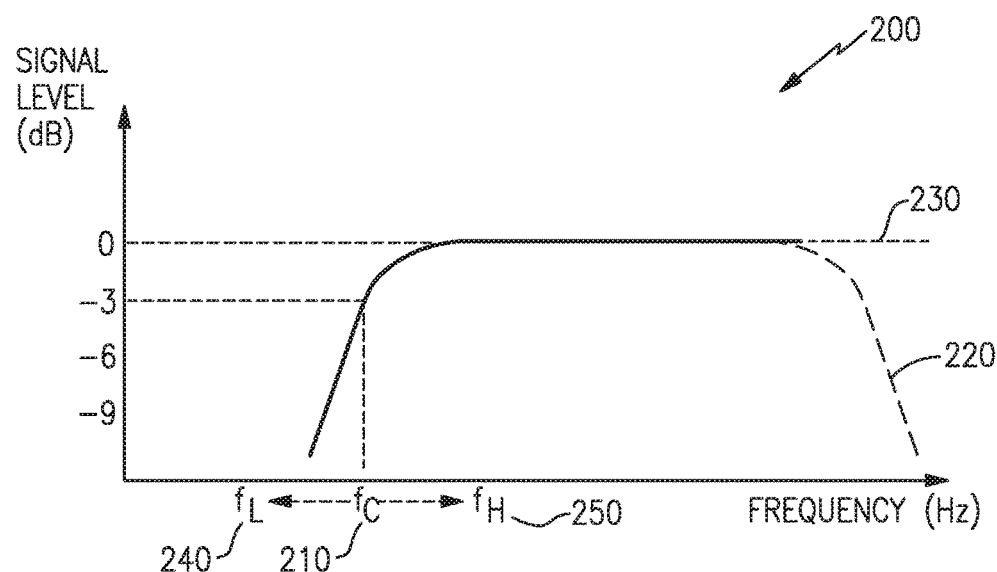
FIG. 2 is a graph of an example frequency response of a filter.

FIG. 2 shows a frequency response curve 200 for a filter 140 having a cutoff frequency 210 below which the filter 140 removes spectral content, i.e., the output signal level is lower for the given spectral content than the input signal. In the example of FIG. 2, the cutoff frequency 210 is a 3 dB frequency, where the output signal is reduced by 3 dB. Some examples may include other standards for "cutoff frequency" and are equally applicable to filters in accord with aspects and examples disclosed herein. For example, some filters are specified by the frequency at which they achieve 1 dB or 10 dB signal reduction. Additionally, a level of attenuation (signal reduction) below the cutoff frequency may have varying slopes, e.g., how much additional attenuation occurs for yet lower frequencies, e.g., 6 dB per octave, 12 dB per octave, etc.

Examples of the frequency response curve 200 for the filter 140 may be band-pass, having additional attenuation at frequencies above a certain level, as shown by the curve portion 220 in FIG. 2, or may be hi-pass and allow all practical frequencies above the cutoff frequency 210 to pass, as shown by the curve portion 230 in FIG. 2.

The filter 140 is a dynamic filter and the cutoff frequency 210 is adjusted based upon a background noise in the environment 110. As illustrated in FIG. 2, the cutoff frequency 210 may be adjusted between a lower frequency 240 and a higher frequency 250. For some examples, the lower frequency may be about 100 Hz and the higher frequency may be about 200 Hz or about 250 Hz. In other examples, the lower frequency may be about 60 Hz or may otherwise be in a range from about 50 Hz to 120 Hz. Additionally, the higher frequency may be about 300 Hz in various examples and may otherwise be in a range from about 200 Hz to 400 Hz, or about 200 Hz to 600 Hz. Particular values for the lower frequency 240 and the higher frequency 250 may be application dependent, and may depend upon the nature of the environment 110, available materials and/or processing capability of the components used in the filter 140, and/or the purpose to which the output signal 160 will be applied. In some examples, a default value or range for the lower frequency 240 and the higher frequency 250 may be pre-configured and/or user selectable for specific applications, such as for being outside (e.g., wind noise), in a car (e.g., road noise), in a plane (e.g., engine noise), and the like.

Figure 3:
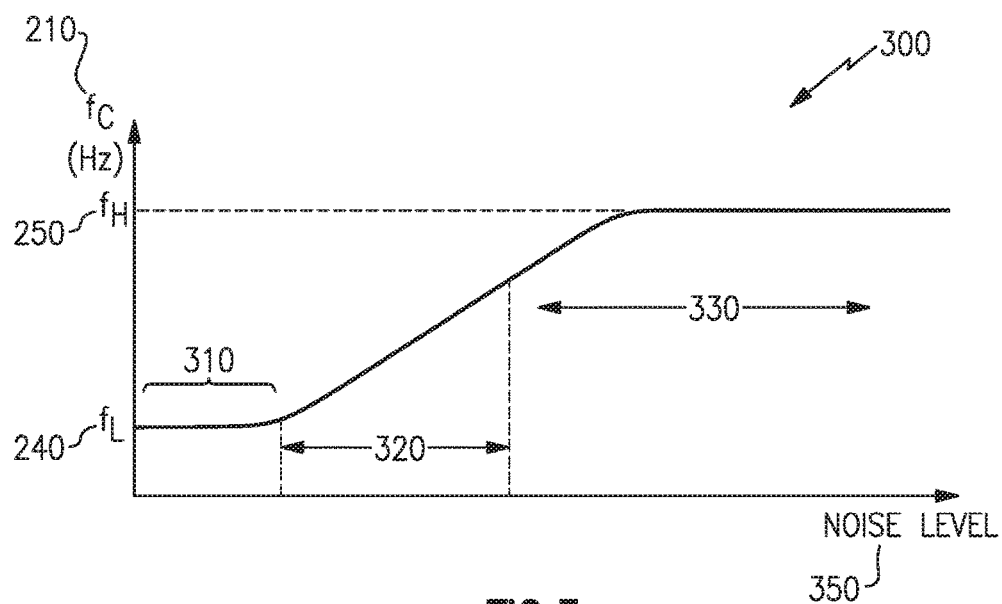
FIG. 3 is a graph of an example mapping of noise levels to cutoff frequencies.

As discussed above, the cutoff frequency 210 is dynamically established based upon a level of noise. FIG. 3 is a graph 300 of one example of a mapping of the cutoff frequency 210 to noise level 350. The graph 300 shows a quiet region 310 where the cutoff frequency 210 is set to the lower frequency 240 and is maintained there for various relatively low noise levels 350. In a mildly noisy environment, illustrated as the region 320, the cutoff frequency 210 may be linearly increased relative to the noise level 350, while in very noisy environments, e.g., the region 330, the cutoff frequency 210 may increase all the way to the higher frequency 250. The example mapping illustrated by the graph 300 in FIG. 3 is merely one example, and acoustic designers or audio system designers may use various mappings that may look different than that shown in the example graph 300. For example, some examples of the filter 140 may exponentially increase the cutoff frequency 210 and reach the higher frequency 250 sooner, i.e., at lower noise level 350. In certain examples, the mapping of cutoff frequency 210, within the bounds of the lower frequency 240 and the higher frequency 250, is monotonically increasing.

In some examples, the noise level used as the control input to the filter 140, e.g., the abscissa in the example mapping function of FIG. 3, may be a measure of the noise in the frequency range between the lower frequency 240 and the higher frequency 250. In other examples, the noise level used as the control input may be a measure of the noise across a broader or otherwise differing frequency range. Further, the noise level used as the control input may be a measure of the noise content of the audio signal or may be a measure of the noise content in the environment 110 more generally.

Noise levels may be measured based upon varying techniques. The noise level 350 shown on the graph 300 is merely an example having no reference values, but noise level 350 may be measured in decibels relative to a particular energy level reference, e.g., dBm, or may be an amplitude-based measurement rather than energy level measure. In certain examples, the noise level 350 is merely an estimated noise level. For example, the noise signal 150 (see FIG. 1) may be a noise estimate signal. Additionally, the noise signal 150 may come from any of multiple sources, depending upon application, environment, and availability.

For example, a noise signal may be provided by a strategically placed microphone, a combination of a group of microphones using array techniques, or may be a noise estimate from another processing system, such as an adaptive filter used in an active noise reduction system, which produces an internal noise estimate that may be used as the noise estimate by the filter 140, or other sources. Strategically placed microphones include microphones positioned with the intent to be responsive to the environment generally and have reduced response to a user's voice, such as a rear-facing microphone on a handset, headset, or headphones, a microphone in the trunk or engine compartment of a vehicle, thereby isolated from the occupants, or a directional microphone in an occupant compartment but directed toward the floor, or the like. A number of microphones may have their output signal combined using array techniques to steer a null (e.g., a reduced responsiveness) toward the location of a user's voice, such as on a handset, headset, or headphone having multiple microphones, or in a vehicle having multiple microphones in a compartment. Additionally, in some examples, a noise estimate may be received or derived from the audio signal, e.g., the audio signal 132 of FIG. 1. For example, the overall spectral content of the audio signal 132 may be analyzed to estimate the amount of noise, or other spectral or noise analysis techniques may be used.

The noise level, such as the noise level 350 of FIG. 3, used as the basis for establishing, selecting, or determining a cutoff frequency 210 may be a broad spectrum noise level, encompassing a broad range of frequencies to indicate a background noise level generally, or may be limited in spectrum to a lower frequency band. In some examples, the noise level used as the basis for mapping to a cutoff frequency 210 is a noise level associated with the frequency band in the range of the lower frequency 240 to the higher frequency 250. In other examples, the relevant noise level may be associated with a range of about 50 Hz to 1,000 Hz, or may be a range of about 60 Hz to 600 Hz, or may be a range of 100 Hz to 250 Hz. Other frequency ranges may be used as the basis for the noise level 350 to map to a cutoff frequency 210, to accommodate varying performance characteristics or application requirements.

Figure 4:
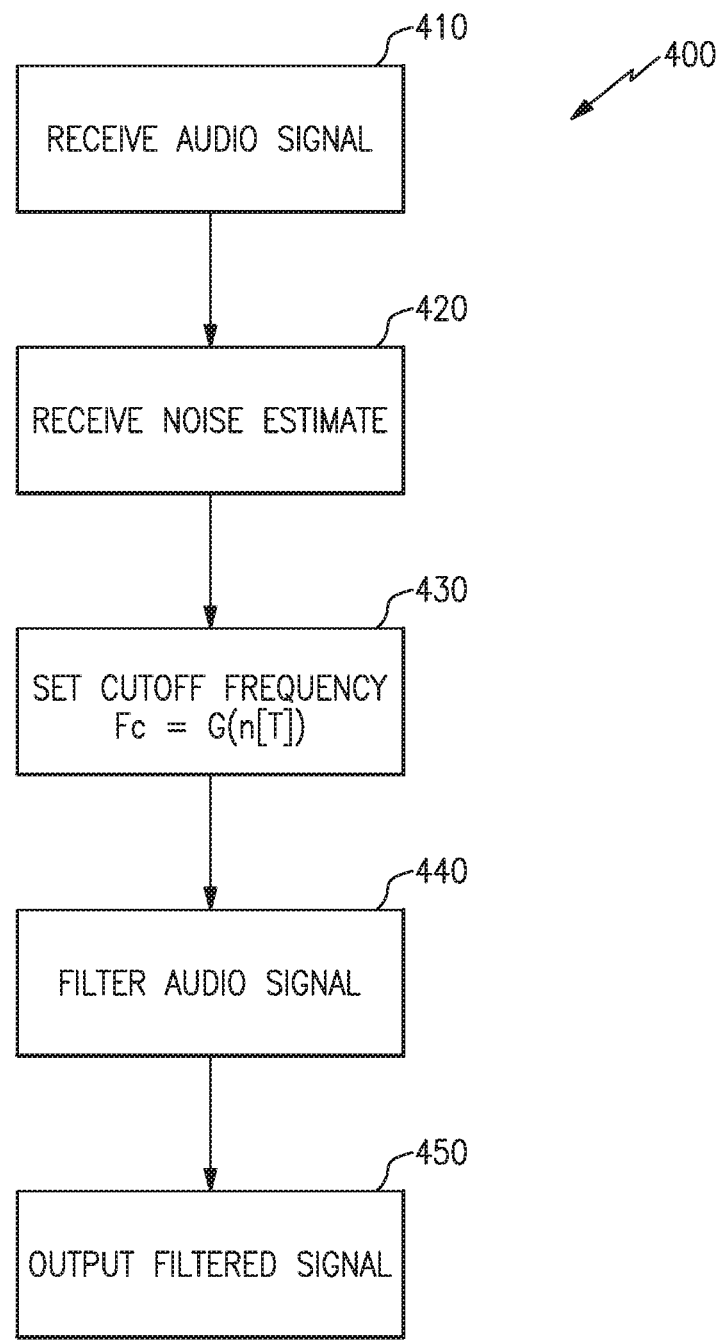
FIG. 4 is flow diagram of an example audio filtering method.

FIG. 4 illustrates an example method 400 of processing an audio signal to enhance linguistically relevant speech components relative to noise components, using a dynamic spectral filter, such as the filter 140 of FIG. 1. The method includes receiving an audio signal (block 410) and receiving a noise estimate (block 420), n[t], which itself may be derived from the audio signal. A cutoff frequency is set at block 430 dependent upon a mapping function, G, which is a function of the noise estimate (e.g., FIG. 3). The audio signal is filtered (block 440) to reduce spectral content below the cutoff frequency, and the resulting filtered signal is output (block 450).

The system 100 (see FIG. 1) and/or the method 400 may routinely or continuously sample the noise estimate to update the cutoff frequency. It may be desirable to limit the amount by which the cutoff frequency may change, be re-set or re-established, from one moment to the next. Accordingly, a smoothing of the mapping function, such as by a time constant, may be applied so the cutoff frequency will not change too drastically or rapidly. For example, if the background noise in the environment suddenly changes, such as a machine turning off, it may be desirable for the cutoff frequency to slowly change to a new value rather than immediately change based upon the new noise level. One such example of a smoothing function is expressed by equation (1), for which the cutoff frequency at a time, t, depends upon both the current noise level via a mapping function, $G(n[t])$, and the previous cutoff frequency at time t−1. The relative weight of each of the current mapping value and the previous value is determined by a fraction, α.

$$f_c[t] = (1-\alpha)f_c[t-1] + \alpha G(n[t]) \quad (1)$$

Other examples may have other smoothing functions of varying sophistication. For example, additional prior values of cutoff frequency may be factored into a calculation of a current cutoff frequency. Additionally, the total time to reach a new steady cutoff frequency may be on the order of tenths of a second, such as 0.2 to 0.8 seconds, or may be multiple seconds, such as 1.0 to 5.0 seconds.

Figure 5:
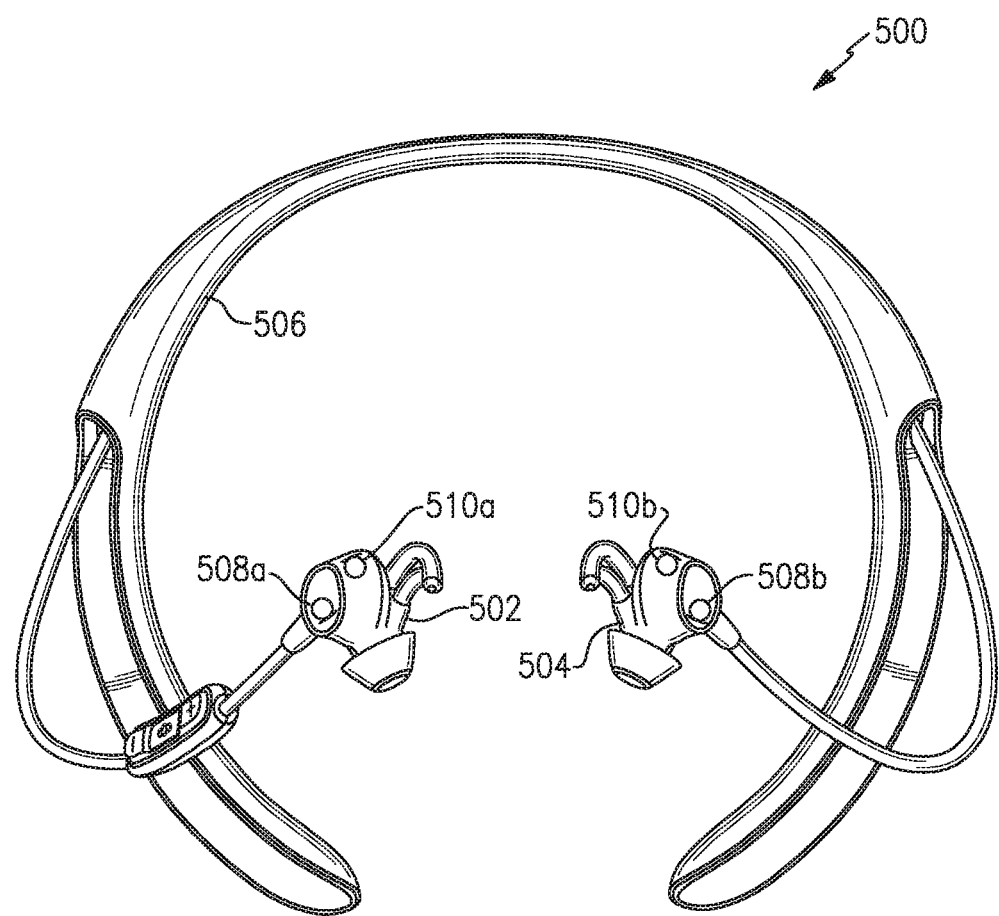
FIG. 5 is a perspective view of an example headset in which an audio filtering system and/or audio filtering method may be implemented.

FIG. 5 illustrates one example of the system 100 and the method 400 advantageously applied in a headset 500. The headset 500 includes two earpieces, e.g., a right earphone 502 and a left earphone 504, coupled to and intercoupled by a neckband 506, to be worn around a user's neck. Each of the earphones 502, 504 include one or more microphones, such as one or more front microphones 508 and one or more rear microphones 510. In some examples, one or more interior microphones may be included in the interior of the right earphone 502 or left earphone 504, and either earphone may have multiple interior microphones, or neither earphone may have an interior microphone. Various examples may have more or fewer front microphones 508 and may have more, fewer, or no rear microphones 510.

In the example of FIG. 5, the four microphones 508, 510 are arranged with the front microphone 508 on each ear pointing generally forward, and the rear microphone 510 on each ear pointing generally rearward. In such manner, the earphones and microphones may be arranged to point their respective pairs of microphones slightly inward when worn, to be more responsive to the user's voice, e.g., by the front microphones 508 or by the set of microphones 508, 510 if operated as an array directed toward the user's mouth. Additionally, the rear microphones 510 may be pointed away from the user's mouth and toward the rear, thus being less responsive to the user's voice, e.g., by the rear microphones 510 alone or by the set of microphones 508, 510 if operated as an array directed away from the user's mouth or to steer a null toward the user's mouth. It should be understood that other examples of systems similar to the example headset 500 include single headphones (on only one side), or on-ear and over-the-air headphones, headsets, earpieces, and the like, and may include boom microphones or other arrangements.

Figure 6:
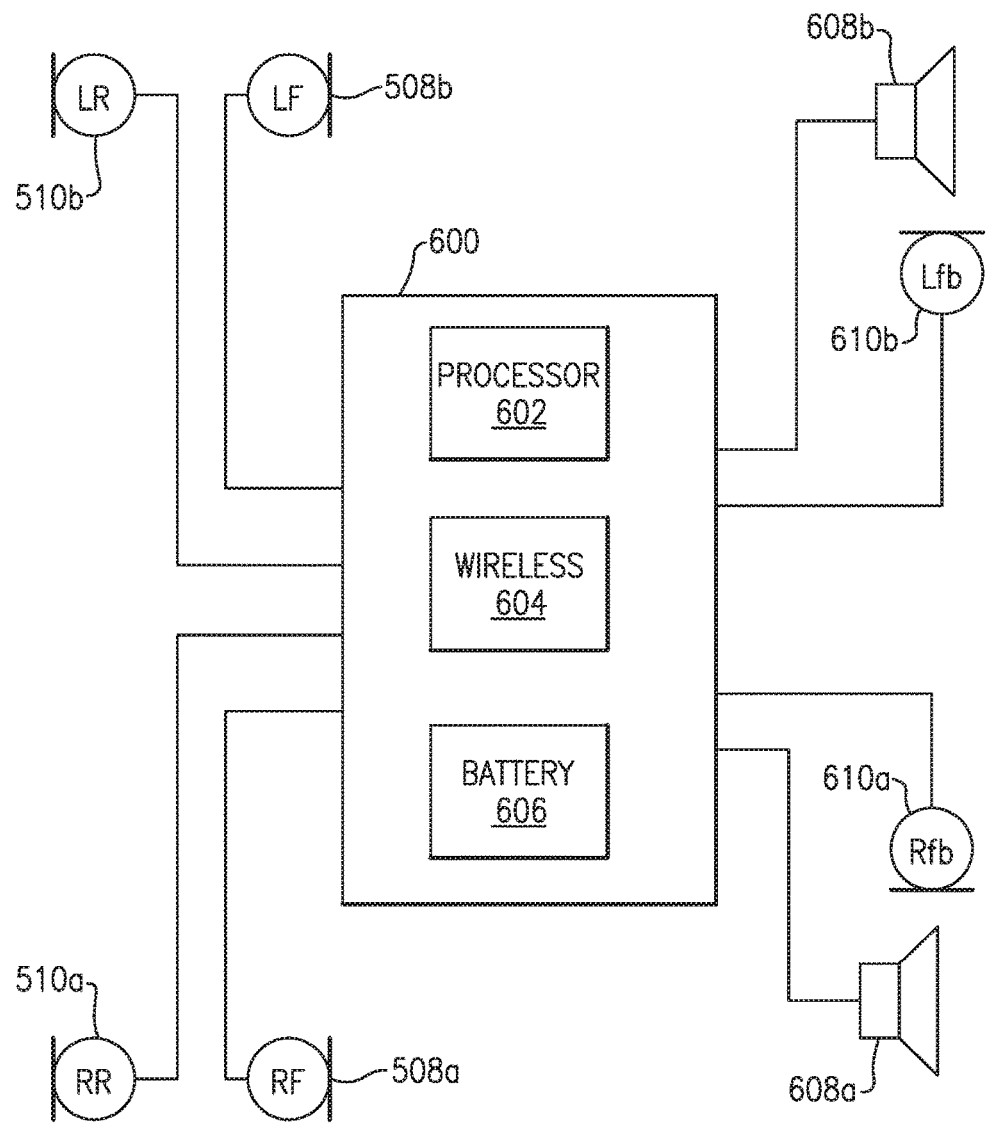
FIG. 6 is a schematic diagram of an example audio processing system such as may be incorporated in a headset.

Shown in FIG. 6 is an example of a central processing unit 600 that may include components of a system, e.g., system 100, and/or perform a signal processing method, e.g., method 400, as part of a larger system, such as a headset, a cellular telephone, a voice-activated personal assistant, an automotive audio system, etc. For the example of a headset, the processing unit 600 may be physically housed somewhere on or within the headset, e.g., the headset 500, such as in the neckband 506. The central processing unit 600 includes a processor 602, wireless communications system 604, and battery 606. With reference to at least the headset example, FIG. 6 also shows speakers 608, associated with each earphone 502, 504, and internal microphones 610 that may be used for feedback-based active noise reduction (sometimes called feedback microphones) or other purposes. In some examples, a processing unit 600 includes a wired communications system instead of or in addition to a wireless communications system.

The processor 602 may apply a number of configurable filters to the signals from the various microphones, including the adjustable filter 140. Either or both of the rear microphones 510 may provide an indication of the environmental noise, due to their location and orientation on the headset 500, and in some examples one or more of the rear microphones 510 may be applied as a noise estimate or other measure of the noise level, as part of the control input to the filter 140. In such examples, one or more of the front microphones 508 may provide the audio signal to be filtered by the filter 140.

Either or both of the front microphones 508 may provide the audio signal that includes the user's speech, due at least in part to their location and orientation on the headset 500. In some examples, signals from the left and right front microphones 508 may be added together to provide the speech audio signal to be filtered by the filter 140. Specifically, the user's voice may be symmetric to the left and right sides (e.g., arriving at the left and right sides at substantially the same time, with substantially equal intensity and phase), such that an additive combination of the left and right front microphones 508 may provide a signal with increased user speech content. Additionally, signals from the left and right front microphones 508 may be subtracted to provide a noise level signal. Due to the user's voice symmetry, a subtractive difference of signals from the left and right front microphones 508 may effectively cancel out and remove the user's voice, such that the resulting signal contains substantially only components of the environmental sound, i.e., noise, without user speech content.

In some examples, more sophisticated processing of the microphone signals may be used. For example, a set of filters may advantageously use the physical arrangement of a number of microphones to combine the microphone signals to form a near-field array optimized for detecting the user's own voice, or may combine the microphone signals to steer a null to the user's mouth and thereby be optimized to detect the environmental or background noise. As discussed above, in certain examples the output of an adaptive filter, such as in active noise reduction systems, may provide a noise estimate to the filter 140.

Figure 7:
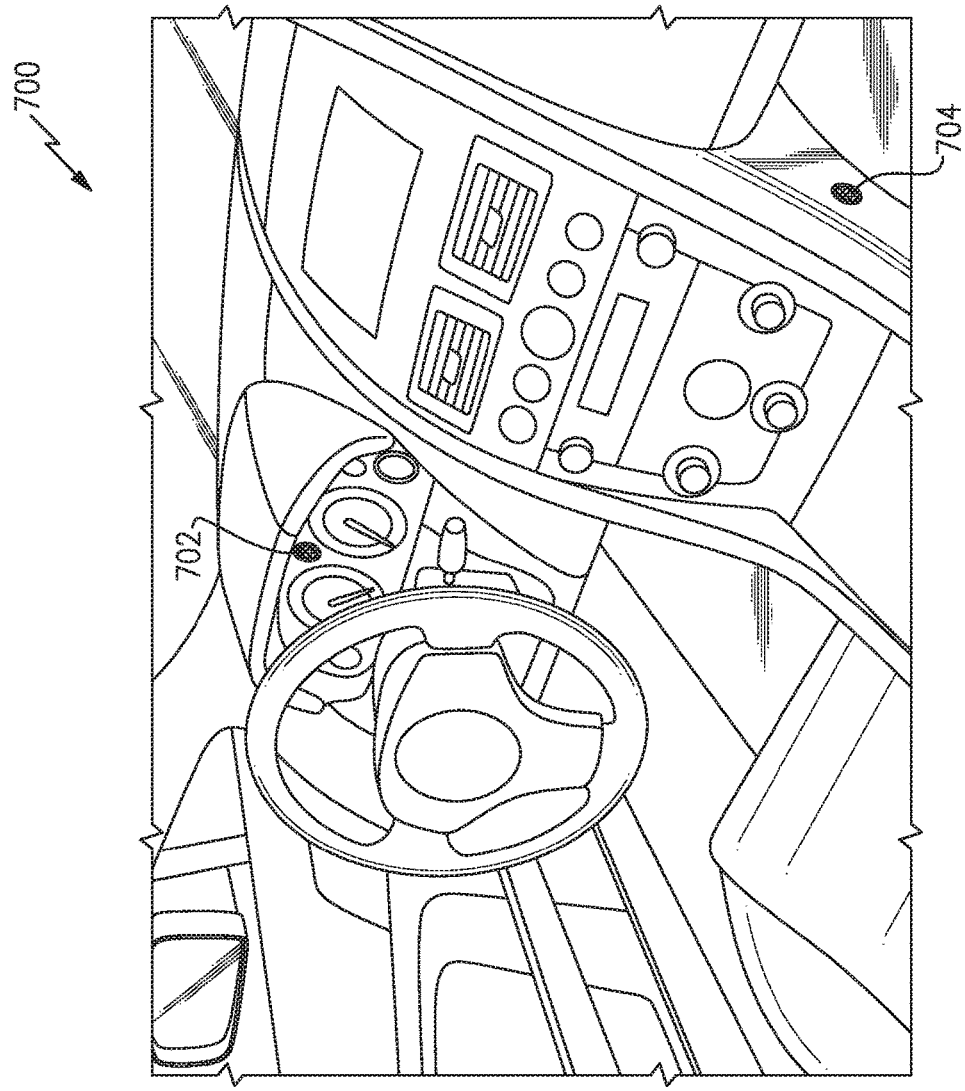
FIG. 7 is a perspective view of an example passenger compartment in which an audio filtering system and/or audio filtering method may be implemented.

FIG. 7 illustrates another example of the system 100 and the method 400 advantageously applied in an automobile compartment 700. In such example, an audio system may include processing units (such as processing unit 600) that may include a filtering system and/or method in accord with aspects and examples disclosed herein. For example, the compartment 700 may include a driver microphone 702 configured to pick up a driver's voice when speaking, for example by being positioned to be directed generally toward the driver's head. Additionally, the compartment 700 may include an ambient microphone 704 configured to pick up ambient noise in the compartment 700, for example by being positioned to be directed generally away from the driver's head and/or directed toward a common source of noise in the compartment 700, such as the floor, engine compartment, trunk, etc.

In some examples, the driver microphone 702 may provide the audio signal to be filtered by the filter 140, and the ambient microphone 704 may provide a measure or estimate of the noise level as the control input to the filter 140 upon which the cutoff frequency is selected. In certain examples, additional microphones may be employed to provide either or both of the audio signal and the noise level to the filter 140. In some examples, additional processing may be employed, such as array beam-forming and null-steering techniques, and outputs of adaptive filters, and the like, as discussed above, to provide either or both of the audio signal and the noise level to the filter 140.

It should be understood that many, if not all, of the functions, methods, and/or components of the systems disclosed herein according to various aspects and examples may be implemented or carried out in a digital signal processor (DSP), a microprocessor, a logic controller, logic circuits, and the like, or any combination of these, and may include analog circuit components and/or other components with respect to any particular implementation. Functions and components disclosed herein may operate in the digital domain and certain examples include analog-to-digital (ADC) conversion of analog signals generated by microphones, despite the lack of illustration of ADC's in the various figures. Any suitable hardware and/or software, including firmware and the like, may be configured to carry out or implement components of the aspects and examples disclosed herein, and various implementations of aspects and examples may include components and/or functionality in addition to those disclosed.

Various examples of a dynamically adjusted filter, such as the filter 140, may include various frequency filtering types or methods. For example, frequency filtering the audio signal to remove components below the cutoff frequency may include filter implementations that allow filtering coefficients (e.g., in the digital realm) to be calculated directly from the cutoff frequency value. Such an example may have reduced computational complexity and reduced memory requirements. In some examples, a Butterworth filter may be included. In some examples, a finite impulse response (FIR) filter may be included, and may further include, or be implemented by, windowing an ideal frequency response.

Some systems and/or methods in accord with aspects and examples disclosed herein may have limited computing and/or energy resources and may implement a system similar to the system 100, or a filter similar to the filter 140, or a method similar to the method 400, in such a manner to reduce the energy or computing resources needed. In one such example, the filter 140 may include a plurality of pre-configured filters with set cutoff frequencies, each of less complexity and requiring fewer resources than a fully dynamic filter capable of any cutoff frequency within a selected range, e.g., the lower frequency 240 up to the higher frequency 250 (see FIGS. 2-3). For example, and with reference to FIG. 8, a graph 800 illustrates a mapping function of a noise level 810 to a cutoff frequency 820 having a limited set of values 830 within a range of a lower frequency 840 to a higher frequency 850. In the example illustrated by FIG. 8, there are six possible values for the cutoff frequency 820, and a filter 140 to implement such a mapping function may include six filters, each having one of the six frequency values as a cutoff frequency. The filter 140 (and the method 400) may select the filter to be used at any given time in accord with the mapping function illustrated in FIG. 8. Accordingly, each of the six filters may be of a simpler design, or require fewer computing resources, or both, as compared to other examples of the filter 140 disclosed herein.

Having described above several aspects of at least one example, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A method of increasing relevant content of an audio signal relative to a noise level, the method comprising:
   receiving an audio signal;
   receiving a noise measurement;
   selecting a cutoff frequency based upon the noise measurement;

selecting a pre-configured filter from among a plurality of pre-configured filters, the selected pre-configured filter based on the selected cutoff frequency;

filtering the audio signal, by the selected pre-configured filter, to substantially reduce spectral content below the cutoff frequency from the audio signal to provide a filtered signal; and providing the filtered signal to a processor configured to analyze the filtered signal to detect a spoken word.

2. The method of claim 1 wherein selecting the cutoff frequency based upon the noise measurement includes selecting the cutoff frequency based upon a mapping of a range of frequencies to noise levels.

3. The method of claim 2 wherein the mapping of the range of frequencies to noise levels includes a monotonically increasing function of frequency to noise level.

4. The method of claim 2 wherein the range of frequencies includes a lower frequency of 100 Hz or less and a higher frequency of 200 Hz or more.

5. The method of claim 1 wherein selecting the cutoff frequency based upon the noise measurement includes selecting the cutoff frequency based upon a mapping of a set of discrete frequencies to noise levels.

6. The method of claim 1 further comprising limiting a rate of change of the cutoff frequency based upon a change in the noise measurement.

7. The method of claim 1 further comprising providing the noise measurement, the noise measurement based at least in part upon a microphone located in at least one of a headset, a telephone communications system, a voice-activated assistant, or a passenger compartment.

8. A dynamic audio filter, comprising:

an input to receive an audio signal and an output to provide an output signal;

a control input to receive a noise signal, the noise signal indicative of a noise level in the audio signal;

a plurality of pre-configured filters, each of the pre-configured filters having a cutoff frequency; and a filter configured to select and load one of the pre-configured filters and to filter the audio signal to substantially reduce spectral components of the audio signal below the cutoff frequency, the cutoff frequency based upon the noise level.

9. The dynamic audio filter of claim 8 wherein the cutoff frequency is based upon a mapping of a range of frequencies to noise levels.

10. The dynamic audio filter of claim 9 wherein the mapping of the range of frequencies to noise levels includes a monotonically increasing function of frequency to noise level.

11. The dynamic audio filter of claim 9 wherein the range of frequencies includes a lower frequency of 100 Hz or less and a higher frequency of 200 Hz or more.

12. The dynamic audio filter of claim 8 wherein the cutoff frequency is based upon a mapping of a set of discrete frequencies to noise levels.

13. The dynamic audio filter of claim 8 wherein the filter is further configured to limit a rate of change of the cutoff frequency based upon a change in the noise level.

14. A communication system comprising:

a microphone configured to provide an audio signal;

a memory having multiple pre-configured filters stored therein, each of the pre-configured filters comprising at least one of a band-pass filter or a hi-pass filter and having a cutoff frequency below which the pre-configured filter substantially removes spectral components; and a signal processor coupled to the microphone and the memory and configured to receive the audio signal and to filter the audio signal to substantially remove spectral components of the audio signal below the cutoff frequency, using a pre-configured filter selected from among the multiple pre-configured filters, the cutoff frequency based upon a noise level in a vicinity of the microphone, and provide the filtered audio signal to a system configured to detect a spoken word.

15. The communication system of claim 14 wherein the cutoff frequency is based upon a mapping of a range of frequencies to noise levels.

16. The communication system of claim 15 wherein the mapping of the range of frequencies to noise levels includes a monotonically increasing function of frequency to noise level.

17. The communication system of claim 15 wherein the range of frequencies includes a lower frequency of 100 Hz or less and a higher frequency of 200 Hz or more.

18. The communication system of claim 14 wherein the cutoff frequency is based upon a mapping of a set of discrete frequencies to noise levels.

19. The communication system of claim 14 wherein the signal processor is further configured to limit a rate of change of the cutoff frequency based upon a change in the noise level.

20. The communication system of claim 14 further comprising a noise estimate component configured to provide the noise level.

* * * * *